US006999313B2

United States Patent
Shih

(10) Patent No.: US 6,999,313 B2
(45) Date of Patent: Feb. 14, 2006

(54) SIGNAL CONNECTION ASSEMBLY OF COOLING MODULE

(75) Inventor: Shoei-Yuan Shih, Shijr (TW)

(73) Assignee: Epserv Tech Corporation, Taipei Hsien (TW)

( * ) Notice: Subject to any disclaimer, the term of this patent is extended or adjusted under 35 U.S.C. 154(b) by 277 days.

(21) Appl. No.: 10/419,784

(22) Filed: Apr. 22, 2003

(65) Prior Publication Data

US 2004/0212960 A1 Oct. 28, 2004

(51) Int. Cl.
*H05K 7/20* (2006.01)

(52) U.S. Cl. .................. 361/695; 361/687; 361/692; 165/104.33; 454/184

(58) Field of Classification Search .............. 361/678, 361/687, 690, 692–695, 831; 165/80.3, 80.4, 165/165, 185, 121–126; 174/15.1, 16.1; 439/61, 439/894, 485; 312/223.1, 326; 417/423.14, 417/360, 423.5; 415/213.1, 223, 177, 178; 454/184

See application file for complete search history.

(56) References Cited

U.S. PATENT DOCUMENTS

| | | | | |
|---|---|---|---|---|
| 5,101,321 A | * | 3/1992 | Remise et al. ............. | 361/695 |
| 5,562,410 A | * | 10/1996 | Sachs et al. ............. | 415/213.1 |
| 6,075,698 A | * | 6/2000 | Hogan et al. ............. | 361/695 |
| 6,236,564 B1 | * | 5/2001 | Fan ............................ | 361/695 |
| 6,406,257 B1 | * | 6/2002 | Houdek .................... | 415/213.1 |
| 6,414,845 B1 | * | 7/2002 | Bonet ......................... | 361/695 |
| 6,549,406 B1 | * | 4/2003 | Olesiewicz et al. ........ | 361/695 |
| 6,592,449 B1 | * | 7/2003 | Cipolla et al. ............. | 454/184 |
| 6,616,525 B1 | * | 9/2003 | Giraldo et al. ............. | 454/184 |
| 6,690,576 B1 | * | 2/2004 | Clements et al. .......... | 361/695 |
| 6,808,411 B1 | * | 10/2004 | Chen .......................... | 439/485 |
| 6,817,889 B1 | * | 11/2004 | Chang et al. .............. | 439/485 |
| 2003/0161103 A1 | * | 8/2003 | Wrycraft et al. .......... | 361/695 |

* cited by examiner

*Primary Examiner*—Michael Datskovskiy
(74) *Attorney, Agent, or Firm*—Birch, Stewart, Kolasch & Birch, LLP

(57) ABSTRACT

An improved signal connection assembly of cooling module comprises a housing and a cooling module; a panel on the housing has at least one window and the window has a first connecting structure; the cooling module is coupled the window and has a second connecting structure coupled to the first connecting structure thereon for transmitting the control signal, the power supply, or the power supplied by the power supply to the cooling module.

13 Claims, 6 Drawing Sheets

SIGNAL CONNECTION ASSEMBLY OF COOLING MODULE

FIELD OF INVENTION

The present invention relates to an improved signal connection assembly of a heat sink module, more particularly to an assembly that can be removed from or installed onto a panel of a housing quickly.

BACKGROUND OF THE INVENTION

In the area of computer products, heat dispersion is always a problem bothering computer users; particularly, the overheating of a computer often causes system failure or makes the computer unable to operate. Therefore, computer manufacturers try very hard to solve such heat dispersion problem. Some manufacturers design a heat dispersion device that can be installed onto different components, and such heat dispersion device includes a heat sink, a fan, and a heat conduction pipe, so that when such heat dispersion device is installed onto different components for use, the heat produced by different components can be dispersed to assure the normal operation of different components.

Although the foregoing heat dispersion device can disperse the heat produced by the components in their operation, the dispersed heat will remain in the housing of the computer or instrument. Such incomplete heat dispersion may cause abnormal operation or crash to the system when such hot components are operated for a long time.

Therefore, some manufacturers design a window on the panel of the housing and a fan installed onto the window. When the fan is operating, the heat remained in the housing can be discharged outside to assure the normal operation of different components. However, if the fan is damaged or requires maintenance after being used for a period of time, the user or maintenance personnel has to open the external casing of the housing and remove the transmission cable connected to the motherboard or power supply in order to remove the fan for replacement or cleaning. However, the space in the housing is very limited, and thus it is not easy for the user or maintenance personnel to remove or install the transmission cable and the fan, which may cause problems to the disassembling and installation.

SUMMARY OF THE INVENTION

The primary objective of the present invention is to solve the aforementioned problems and eliminate the drawbacks of cited prior art by using a novel structural design to let the user or maintenance personnel quickly install or remove the cooling module onto/from the panel of a housing without removing the external casing of the housing and the transmission cable.

To achieve the foregoing objective, the improved signal connection structure of cooling module according to the present invention comprises a housing and a cooling module; a panel on the housing has at least one window and the window has a first connecting structure; the cooling module is coupled the window and has a second connecting structure coupled to the first connecting structure thereon for transmitting the control signal, the power supply, or the power supplied by the power supply to the cooling module.

DETAILED DESCRIPTION OF THE PREFERRED EMBODIMENTS

To make it easier for our examiner to understand the objective of the invention, its structure, innovative features, and performance, we use a preferred embodiment together with the attached drawings for the detailed description of the invention.

Figure 1:
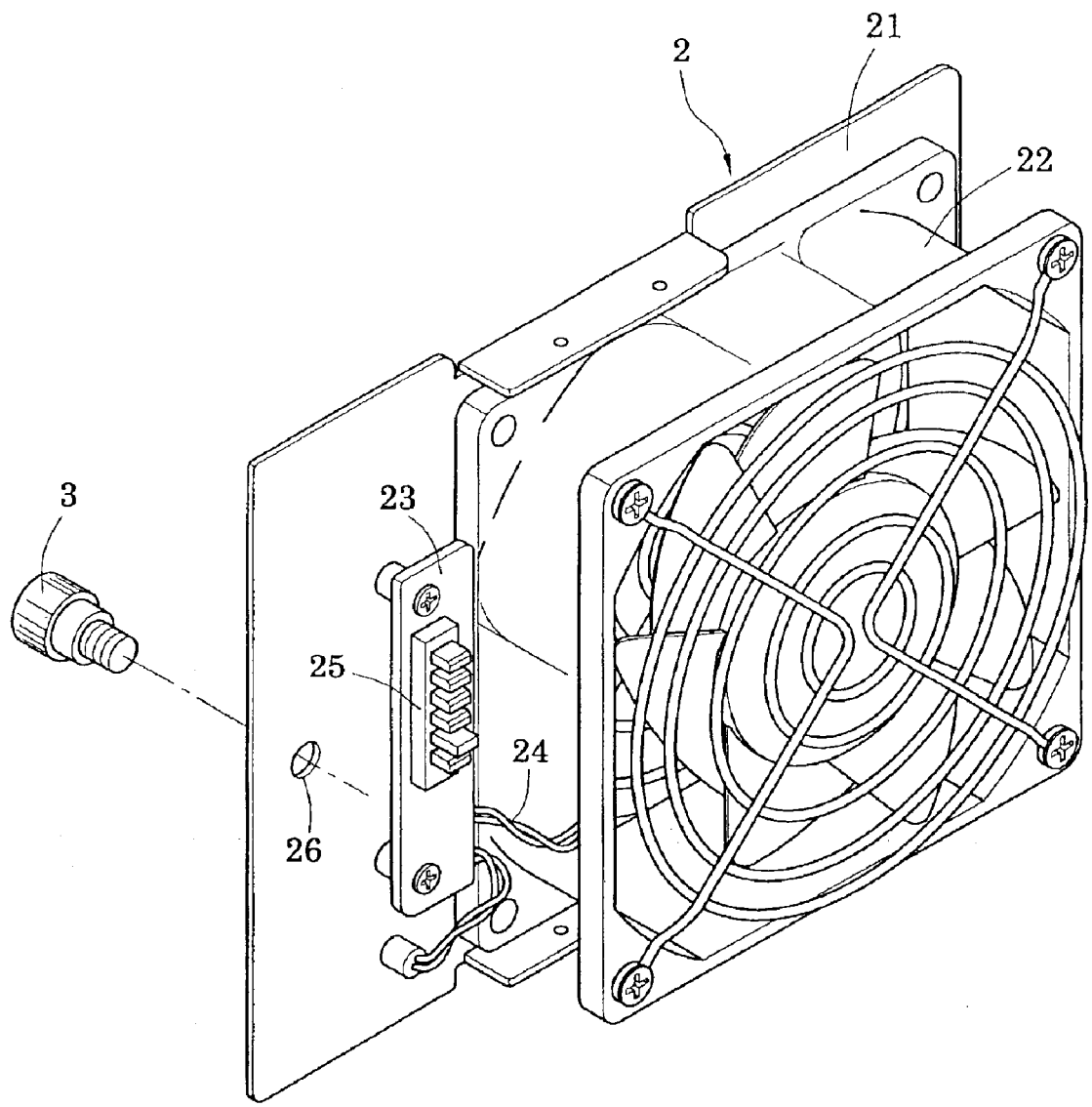
FIG. 1 is a perspective diagram of the cooling module of the present invention.
Figure 2:
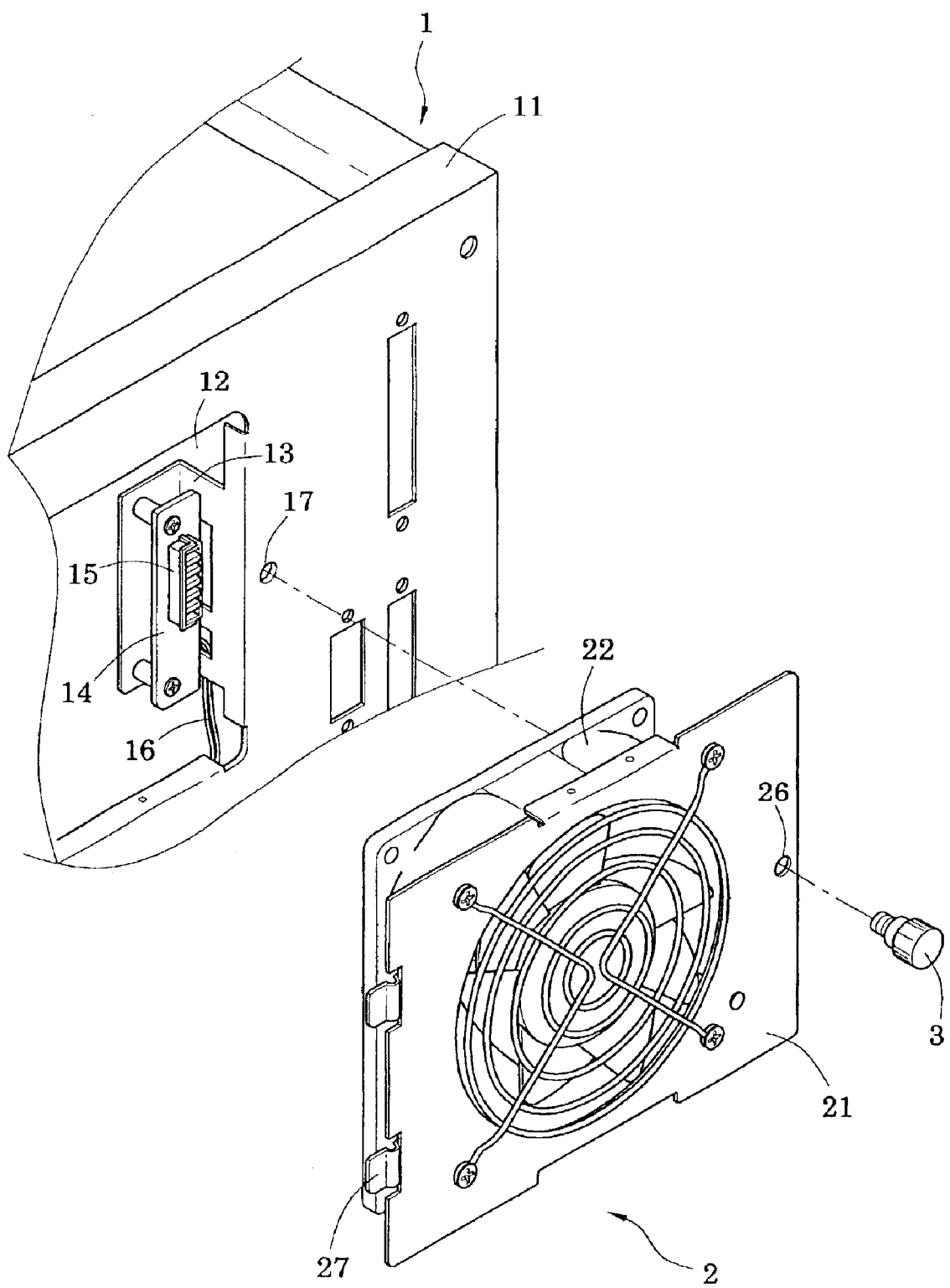
FIG. 2 is a perspective diagram of part of the main system of the present invention.

Please refer to FIGS. 1 and 2 for the perspective diagrams of the cooling module and part of the main system of the present invention. In the figures, the improved signal connection assembly of cooling module according to the present invention comprises a housing 1 and a cooling module 2 installed onto said housing 1, so that the cooling module 2 can be installed or removed onto/from the housing 1, and the heat produced by the components in their operation in the housing 1 can be discharged out of the housing 1 to assure the normal operation of the component in the housing 1.

Said housing 1 has a panel 11; said panel 11 has at least one window 12; said window 12 has a carrying section 13, and said carrying section 13 has installed a circuit board 14 and a connector 15 to constitute a first connecting structure; said circuit board 14 is connected to a transmission cable 16; said transmission cable 16 is connected to a motherboard (not shown in the figure) or a power supply (not shown in the figure) in the housing to transmit the control signal and power supply on the motherboard or the power supplied by the power supply to the connector 15; further, an assembling section 17 is disposed along the edge of the window 12 on the panel 11 for connecting the cooling module 2; said cooling module 2 comprises a carrying board 21 and a fan 22 disposed on the carrying board 21; said carrying board 21 has a circuit board 23 disposed on one side of said fan 22, and said circuit board is coupled to a connector 25 to constitute a second connecting structure, so that after the second connecting structure is connected to said first connecting structure, the control signal and power supply on the motherboard or the power provided by the power supply can be transmitted to the fan 22 to control the operation of the fan 22; further, a connecting opening 26 disposed on one end of the carrying board 21 for passing a fixing structure 3 and coupling to the assembling section 17 on the housing 1. Therefore, the foregoing components constitute a novel signal connection structure of a fan.

Figure 3:
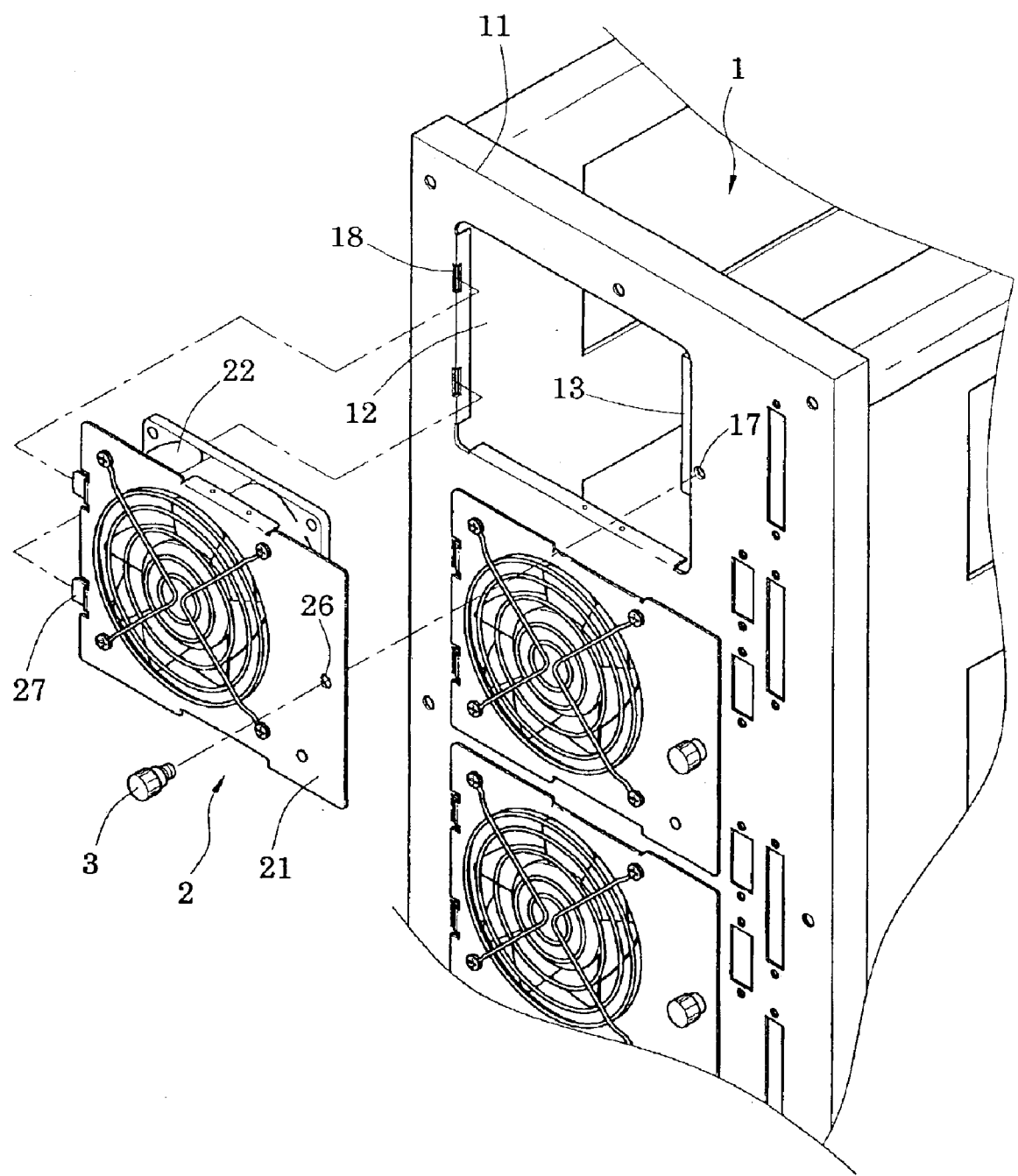
FIG. 3 is an illustrative diagram of using statuses as shown in FIGS. 1 and 2.
Figure 4:
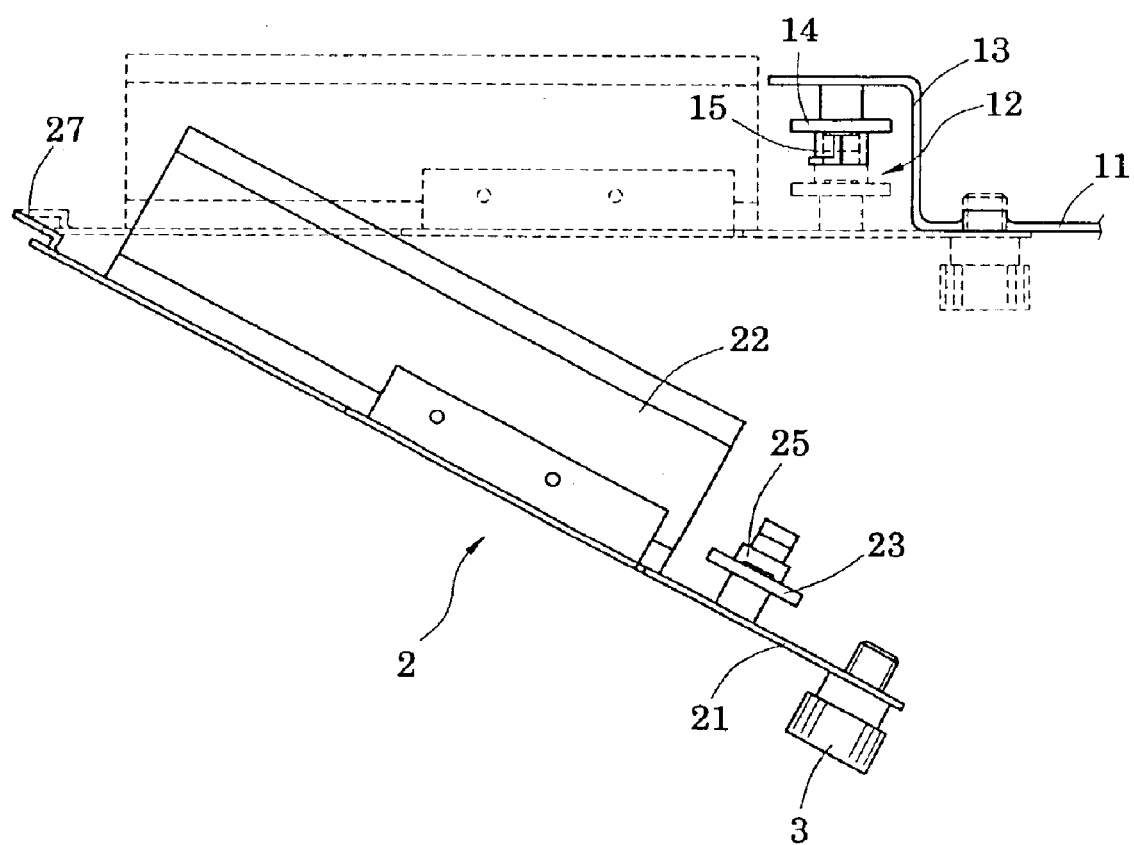
FIG. 4 is an illustrative diagram of installing the heat dispersion device onto the main system according to the present invention.

Please refer to FIGS. 3 and 4 for the illustrative diagrams of the using status and the assembling movements of the cooling module and the main system. In the figures, when the cooling module 2 is installed onto the panel 11 of the housing 1, a protrusion 27 at one end of the carrying board 21 is inserted into an insert hole 18 on an edge of the window 12 of the panel 11, and then one end of the carrying board 21 is attached closely onto another edge of the window 21, so that the connector 25 on the cooling module 2 will be coupled to the connector 15 as the carrying board 21 is attached closely onto the window 12, and a fixing structure 3 is coupled to the assembling section 17 to secure the cooling module 2 onto the panel 11 of the housing 1.

After the connector 15 is connected to the connector 25, the control signal and power supply provided by the main board or the power supplied by the power supply in the housing 1 will be transmitted to the fan 22 to drive the fan to rotate. Under the operation of the fan 22, the heat produced by the operation of each component in the housing 1 can be discharged out of the housing 1 to achieve the purpose of dispersing heat and assure the normal operation of each component in the housing 1.

Figure 5:
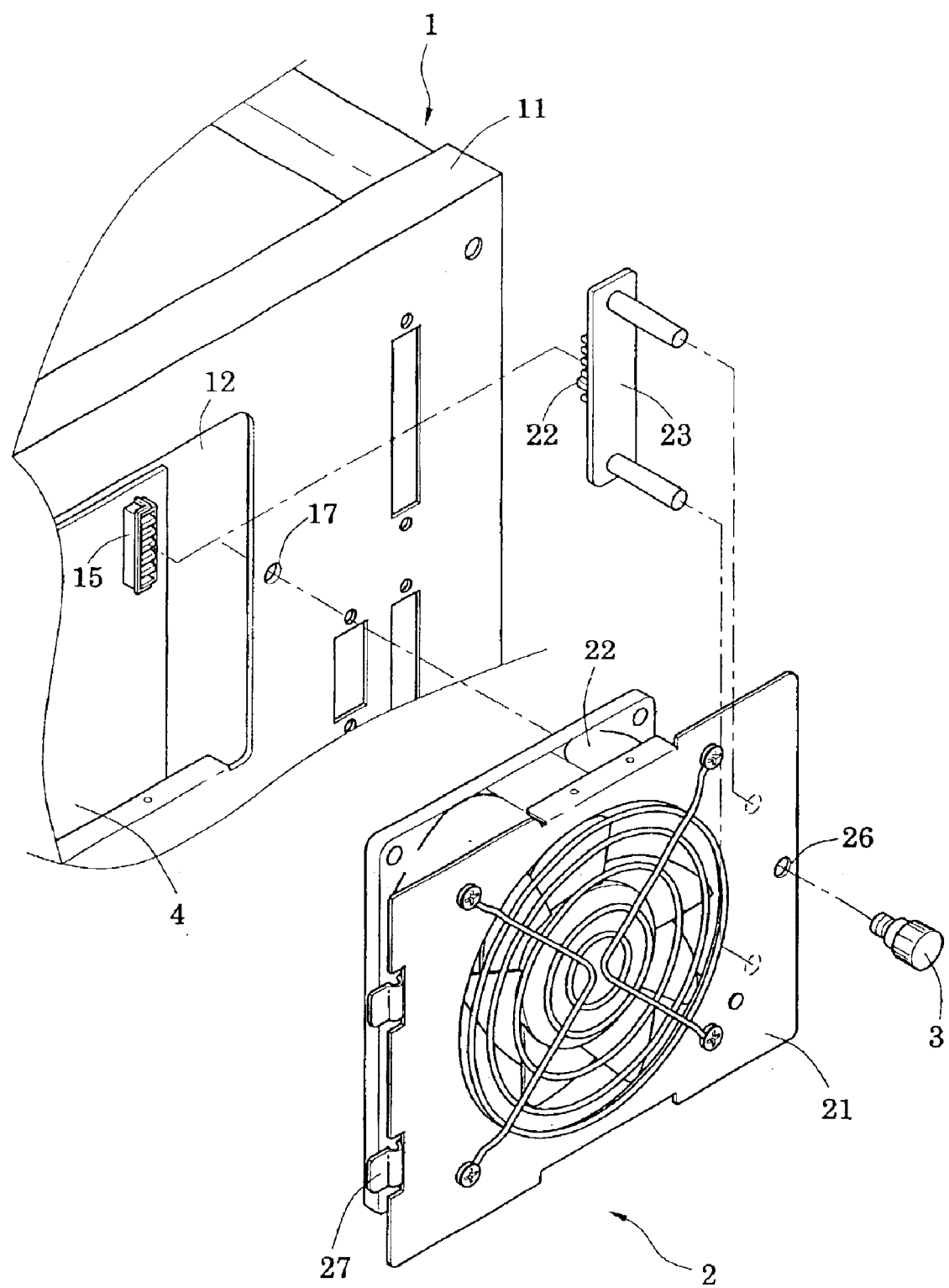
FIG. 5 is an illustrative diagram of another preferred embodiment of the present invention.

Please refer to FIG. 5 for another preferred embodiment of the present invention. As shown in the figure, this embodiment is substantially the same as the previous one, and the difference relies on that when the previous carrying section 13 is directly installed onto a circuit board 4 in the housing 1, the connector 15 directly disposed on the circuit board 4, the cooling module 2 coupled onto the window 12 of the panel 11, the connector 22 of the cooling module 2 can be inserted directly onto the connector 15.

Figure 6:
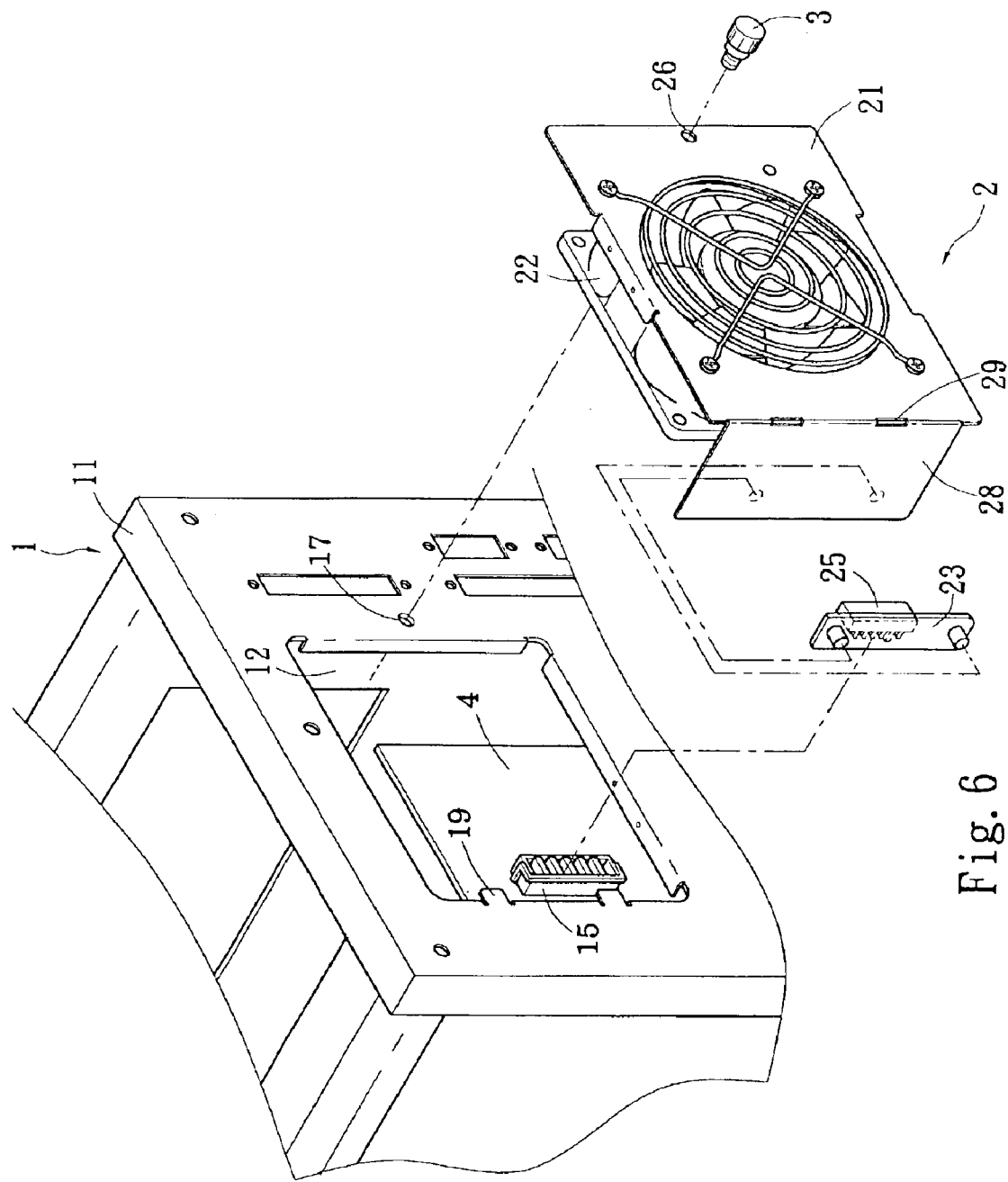
FIG. 6 is an illustrative diagram of a further preferred embodiment of the present invention.

Please refer to FIG. 6 for the illustrative diagram of a further embodiment of the present invention. As shown in the figure, this embodiment is substantially the same as the previous one, and the difference relies on that a protrusion 19 is disposed on one side of the window 12 of the panel 11; an extension section 28 is disposed on one side of the carrying board 21 of the cooling module 2; a connecting opening 29 is disposed at the connection of the extension section 28 and the carrying board 21; a second connecting structure is disposed on the extension section 28, and when the connecting opening 29 is connected to the protrusion, the connector 25 mounted to the extension section 28 can be inserted directly into the connector 15, and then secured onto the assembling section 17, so that the cooling module can be secured onto the panel 11 of the housing 1.

Further, besides controlling the operation of the fan 22 and returning various status signals upon their receipt by the fan 22 during its operation, the way of connecting the connector 15 and the connector 25 in accordance with the present invention also allows users or maintenance personnel to quickly remove or install the cooling module 2 from/onto the panel 11 of the housing 1 in order to save the time and procedure for the disassembling or installation by users or maintenance personnel.

Further, besides computer housing, the present invention can also be applied to the housing of all kinds of instruments.

What is claimed is:

1. An improved signal connection structure for cooling module, for discharging the heat produced by each component in a housing, said structure comprising:

a housing, having a panel, and said panel having at least one window, and said window having a carrying section, and said carrying section having a first connecting structure, said first connecting structure comprising a circuit board and a connector;

a cooling module, being coupled to said window and having a carrying board, and said carrying board having a second connecting structure coupled to said first connecting structure; thereby, said cooling module being coupled to said window to connect the first connecting structure with the second connecting structure, so that the control signal and power supply provided by a motherboard and the power supply provided by a power supply being transmitted to said cooling module or transmitting each status of the operation of said cooling module to the motherboard.

2. The improved signal connection structure for cooling module of claim 1, wherein said circuit board connects to a transmission cable, and said transmission cable connecting to the motherboard or power supply in the housing.

3. The improved signal connection structure for cooling module of claim 1, wherein said window on the panel has an assembling section.

4. The improved signal connection structure for cooling module of claim 3, wherein said window on the other side has an insert hole.

5. The improved signal connection structure for cooling module of claim 3, wherein said window has a protrusion on one side.

6. The improved signal connection structure for cooling module of claim 1, wherein said carrying board has a fan.

7. The improved signal connection structure for cooling module of claim 1, wherein said second connecting structure is comprised of a circuit board and a connector.

8. The improved signal connection structure for cooling module of claim 7, wherein said circuit board is coupled to a transmission cable, and said transmission cable is coupled to a fan.

9. The improved signal connection structure for cooling module of claim 1, further comprising a fixing structure for securing the carrying board onto the panel.

10. The improved signal connection structure for cooling module of claim 1, wherein said carrying board has a connecting opening for passing the fixing structure at one end.

11. The improved signal connection structure for cooling module of claim 1, wherein said carrying board has a protrusion at one end.

12. The improved signal connection structure for cooling module of claim 1, wherein said carrying section has a circuit board mounted on said carrying section.

13. The improved signal connection structure for heat cooling module of claim 1, wherein said carrying board has an extension section at one end and a connecting opening is disposed at the connection between said extension section and said carrying board.

* * * * *